United States Patent
Baughman (10) Patent No.: US 9,267,996 B2
(45) Date of Patent: *Feb. 23, 2016

(54) METHOD AND SYSTEM FOR ESTIMATING VOLTAGE OF A BATTERY ELEMENT

(71) Applicant: GM GLOBAL TECHNOLOGY OPERATIONS LLC, Detroit, MI (US)

(72) Inventor: Andrew C. Baughman, Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 387 days.

This patent is subject to a terminal disclaimer.

(21) Appl. No.: 13/804,151

(22) Filed: Mar. 14, 2013

(65) Prior Publication Data

US 2014/0266222 A1 Sep. 18, 2014

(51) Int. Cl.
G01N 27/416 (2006.01)
G01R 31/36 (2006.01)
H02J 7/00 (2006.01)
H01M 10/42 (2006.01)

(52) U.S. Cl.
CPC ............ *G01R 31/362* (2013.01); *H01M 10/425* (2013.01); *H02J 7/00* (2013.01); *H02J 7/0021* (2013.01); *G01R 31/3651* (2013.01); *H01M 2010/4271* (2013.01)

(58) Field of Classification Search
CPC ...................................................... H02J 7/0014
USPC ................................... 320/116–119; 324/426
See application file for complete search history.

(56) References Cited

U.S. PATENT DOCUMENTS 6,268,710 B1* 7/2001 Koga ............................ 320/116
7,834,635 B2* 11/2010 Oosawa et al. ............... 324/429
2012/0025835 A1* 2/2012 Chandler et al. ............. 324/433

FOREIGN PATENT DOCUMENTS

KR 20100028807 A 3/2010
KR 101068156 B1 5/2011

OTHER PUBLICATIONS

Korean Notice of Reason for Rejection dated Feb. 27, 2015, 5 pages.

* cited by examiner

*Primary Examiner* — Drew A Dunn
*Assistant Examiner* — Zixuan Zhou
(74) *Attorney, Agent, or Firm* — Reising Ethington P.C.; Lionel D. Anderson (57) ABSTRACT

A method for estimating the voltage of a battery element of a battery system is provided. In one embodiment, the method comprises providing a balancing/sensing circuit having a series combination of a balancing switch and a balancing resistive element electrically connected in parallel with the battery element, and measuring the voltage across the balancing switch/balancing resistive element combination when the switch is presumed to be in a "closed" state." The method further comprises deriving a compensated value for the measured voltage by applying a calculated compensation factor to the measured voltage, the compensated value compensating for a voltage drop occurring in the balancing/sensing circuit when the balancing switch is in the "closed" state and represents an estimate of the battery element voltage. A battery system is also provided that includes a battery element, a balancing/sensing circuit, a sensor, and a control module configured to perform the method described above.

20 Claims, 5 Drawing Sheets

METHOD AND SYSTEM FOR ESTIMATING VOLTAGE OF A BATTERY ELEMENT

FIELD

The present invention generally relates to vehicle batteries, and more particularly, to methods and systems for estimating the voltage of a battery element in a vehicle, such as a plug-in electric vehicle, during a charge balancing operation performed on the battery element.

BACKGROUND

It is well known that in order to optimize and maximize the performance and life of an electric vehicle battery, the charge levels of the constituent components or elements of the battery, such as, for example, the individual cells or groups of cells of a battery pack, must be periodically balanced or equalized. Such balancing operations, which may be referred to below as "cell balancing" or "cell balancing operations," may be performed using any number of known methodologies or techniques.

One such technique is a passive/resistive cell balancing technique where, in one implementation, each cell (or groups of cells) of a battery pack is electrically connected to a respective balancing/sensing circuit that is configured to provide a means for both balancing the corresponding cell and sensing or measuring electrical parameters relating thereto (e.g., cell voltage). More particularly, in one particular implementation, each balancing/sensing circuit comprises a series combination of a balancing switch and a balancing resistive element (e.g., resistor) that is electrically connected in parallel with the corresponding cell by a pair of sense wires. Additionally, for purposes of diagnosing whether the balancing switch is operational, one or both of the sense wires of the balancing/sensing circuit may include a resistive element (e.g., resistor) that is electrically connected in series to both the cell and the series combination of the balancing switch and balancing resistive element. The inclusion of one or more series resistive elements in the sense wire(s) serves to form a voltage divider within the balancing/sensing circuit (i.e., the series combination of the series resistive element and the balancing resistive element form a voltage divider) and, as a result, causes a voltage drop when the balancing switch is in a "closed" or "on" state and current flows from the cell through the balancing resistive element. When a battery control module, or some other suitable vehicle component, senses or detects such a voltage drop, it may determine that the balancing switch is, in fact, operational, otherwise it may determine that there may be a problem with the balancing switch.

This particular cell balancing technique is not without its drawbacks, however. For example, because of the voltage divider formed in the balancing/sensing circuit, when a balancing switch corresponding to a particular cell is in the "closed" or "on" state during, for example, a cell balancing operation, the voltage measured across the series combination of the balancing switch and balancing resistive element is lower than the actual voltage of the cell. Accordingly, any voltage measurements taken or made while the balancing switch is closed, and therefore, any voltage measurements taken or made during the performance of a cell balancing operation, are effectively useless for any purpose requiring accurate cell voltage measurements (e.g., for the purpose of controlling the cell balancing operation), and thus, must be discarded. As such, the availability of useful cell voltage information and the speed at which such information can be obtained, as well as the sophistication and speed of controls that use such information, is adversely impacted by the lowered or reduced voltage measurements.

SUMMARY

According to one embodiment, there is provided a method for estimating the voltage of a battery element of a vehicle battery system. In an exemplary embodiment, the method may include the step of providing a balancing/sensing circuit having a series combination of a balancing switch and a balancing resistive element electrically connected in parallel with the battery element. The method may further include the step of measuring the voltage across the combination of the balancing switch and balancing resistive element when the balancing switch is presumed to be in a "closed" state." The method may still further include the step of deriving a compensated value for the measured voltage by applying a calculated compensation factor to the measured voltage, wherein the compensated value compensates for a voltage drop occurring in the balancing/sensing circuit when the balancing switch is in the "closed" state and represents an estimate of the actual voltage of the battery element. In an exemplary embodiment, the calculated compensation factor may be derived from measurement(s) of one or more electrical parameters relating to the balancing/sensing circuit.

According to another embodiment, there is provided a method for estimating the voltage of a battery element of a vehicle battery system. In an exemplary embodiment, the method includes the step of providing a balancing/sensing circuit having a series combination of a balancing switch and a balancing resistive element electrically connected in parallel with the battery element. The method may further include the step of calculating a compensation factor to account for a voltage drop occurring in the balancing/sensing circuit when the balancing switch is in a "closed" state. The method may still further include the step of measuring the voltage across the combination of the balancing switch and balancing resistive element when the balancing switch is presumed to be in a "closed" state." The method may yet still further include the step of deriving a compensated value for the measured voltage by applying the calculated compensation factor to the measured voltage, wherein the compensated value compensates for a voltage drop occurring in the balancing/sensing circuit when the balancing switch is in the "closed" state and represents an estimate of the actual voltage of the battery element.

According to another embodiment, there is provided a battery system for a vehicle. In an exemplary embodiment, the battery system may include a battery element and a balancing/sensing circuit having a series combination of a balancing switch and a balancing resistive element electrically connected in parallel with the battery element. The system may further include a sensor electrically connected in parallel with, and configured to measure the voltage across, the combination of the balancing switch and balancing resistive element, and a control module. The control module may be configured to receive an electrical signal representative of a voltage measured by the sensor across the combination of the balancing switch and balancing resistive element when the balancing switch is presumed to be in a "closed" state," and to derive a compensated value for the measured voltage by applying a calculated compensation factor to the measured voltage, wherein the compensated value compensates for a voltage drop occurring in the balancing/sensing circuit when the balancing switch is in the "closed" state and represents an estimate of the actual voltage of the battery element. Further, in an exemplary embodiment, the calculated compensation factor applied to the measured voltage by the control module may be calculated from measurement(s) of one or more electrical parameters relating to the balancing/sensing circuit.

DRAWINGS

Preferred exemplary embodiments will hereinafter be described in conjunction with the appended drawings, wherein like designations denote like elements, and wherein.

DESCRIPTION

The method and system described herein may be used to estimate or otherwise determine the voltage of a battery element (e.g., a portion of a battery pack, a group of cells within a battery pack, an individual cell, etc.) in a vehicle during, for example, the balancing or diagnostic testing of that particular battery element. Skilled artisans will appreciate that having an accurate voltage estimate for a battery element can be useful for certain functions or features in a vehicle, such as a plug-in electric vehicle. For instance, cell balancing operations are an example of a function that rely on battery element voltage estimates and require that they have a requisite level of accuracy. Other such functions and features certainly exist.

For purposes of illustration and clarity, the following description is generally directed to an embodiment where the battery element is an individual cell of a battery pack, and therefore, the voltage being estimated is that of an individual battery cell. It will be appreciated, however, that the present method and system are not meant to be so limited, as they may also be used to estimate the voltage of other battery elements, such as a region or portion of the battery pack, a group of cells within the battery pack, or some other battery element. Accordingly, those embodiments relating to estimating the voltage of battery elements other than an individual battery cell remain within the spirit and scope of the present disclosure. In one exemplary embodiment, the present system and method measure a voltage applied across the series combination of a balancing resistive element and balancing switch by a battery cell connected in parallel therewith when the balancing switch is in the "closed" or "on" state. In an exemplary embodiment, the system and method may then apply a compensation factor to the measured or sensed voltage to estimate the actual voltage of the cell.

Figure 1:
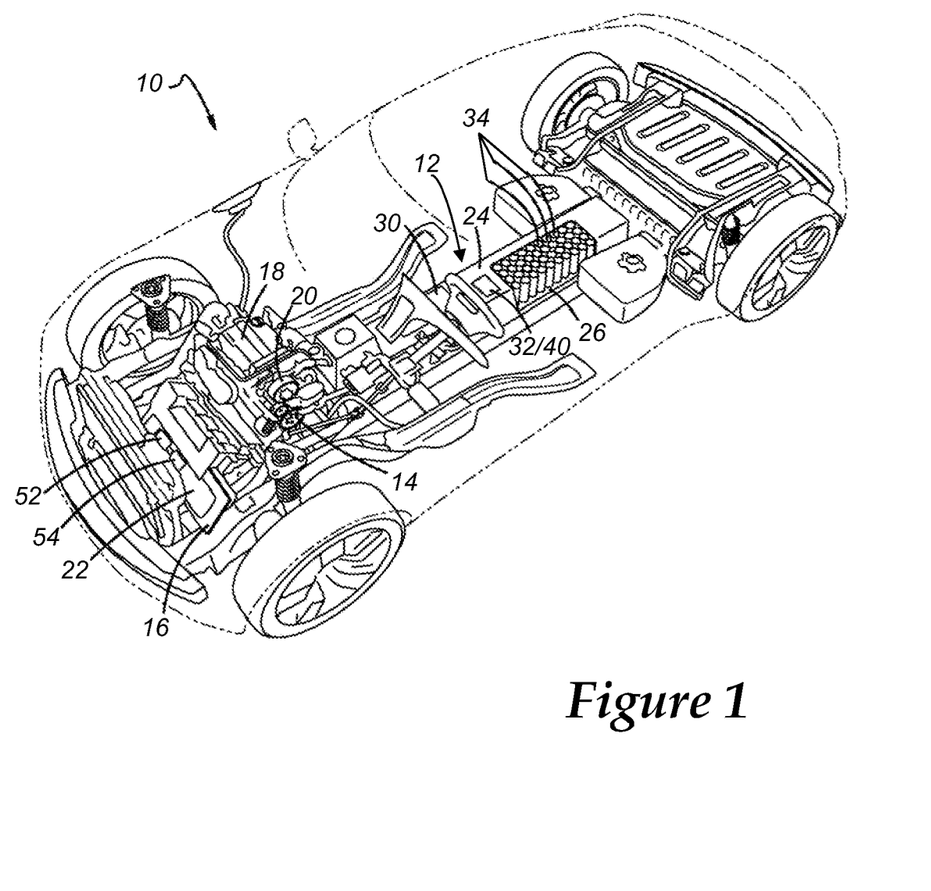
FIG. 1 is a schematic diagram of an exemplary plug-in electric vehicle.

With reference to FIG. 1, there are shown some of the components of an exemplary plug-in electric vehicle 10, with which the present method and system may be used. Although the following description is provided in the context of the particular plug-in electric vehicle 10 illustrated in FIG. 1, it will be appreciated that this vehicle is merely exemplary and that other vehicles may certainly be used instead. For example, the method and system described herein may be used with any type of vehicle having a battery pack, including a hybrid electric vehicle (HEV), a plug-in hybrid electric vehicle (PHEV), an extended-range electric vehicle (EREV), or a battery electrical vehicle (BEV), to cite a few possibilities. According to an exemplary embodiment, vehicle 10 generally includes a vehicle battery system 12, an electric motor 14, an inverter/converter 16, an engine 18, a generator 20, and a control module 22.

Figure 2:
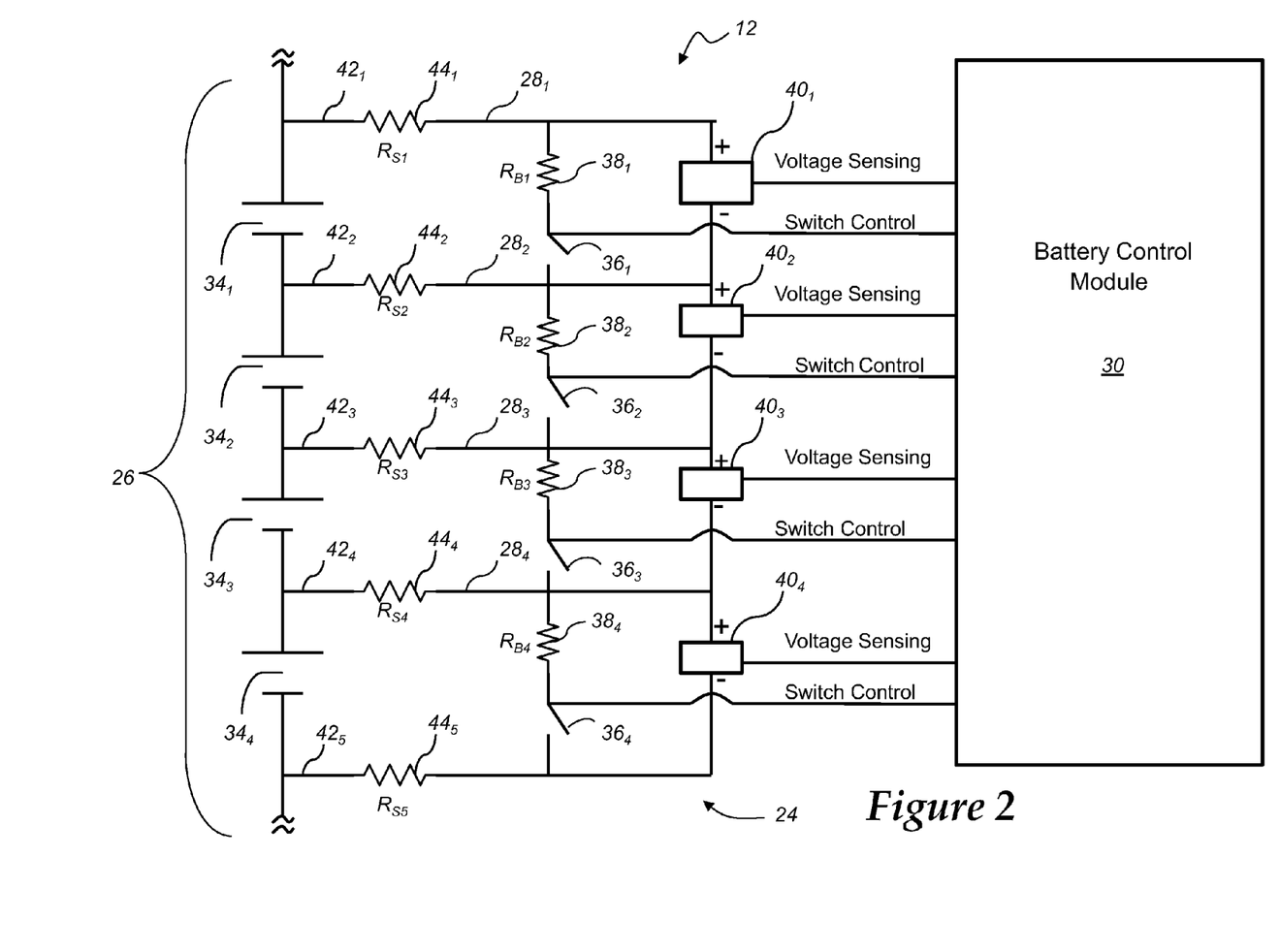
FIG. 2 is a schematic block diagram of a portion of an exemplary vehicle battery system having a number of individual battery cells and that may be used in a number of different vehicles, such as the one illustrated in FIG. 1.

FIGS. 1 and 2 illustrate portions of an exemplary vehicle battery system 12 that includes a battery 24, a battery pack 26, one or more balancing/sensing circuits 28, a battery control module 30, and battery sensors 32. Battery 24 may store electrical energy for vehicle propulsion and/or to meet other electrical needs of the vehicle, such as, for example, the needs of power applications of the vehicle. According to an exemplary embodiment, battery 24 includes a high-voltage battery pack 26 (e.g., 40V-600V) having a number of individual battery cells 34 (i.e., $34_1, 34_2 \ldots 34_N$). These cells 34 may be connected in series, parallel, or a combination of both in order to deliver a desired voltage, amperage, capacity, power density, and/or other performance characteristics. In the example shown in FIG. 2, four battery cells $34_1$-$34_4$ are wired in series with one another. It will be appreciated that FIG. 2 illustrates only one potential embodiment of battery pack 26, as other arrangements, connections, and/or embodiments are also possible.

Battery pack 26 may utilize any suitable battery chemistry, including those that are based on the following technologies: lithium ion, nickel metal hydride (NiMH), nickel cadmium (NiCd), sodium nickel chloride (NaNiCl), or some other battery technology. According to one example, cells 34 of battery pack 26 are lithium-ion battery cells. Battery pack 26 should be designed to withstand repeated charge and discharge cycles, and may be used in conjunction with other energy storage devices, such as capacitors, super capacitors, inductors, etc. Those skilled in the art will appreciate that vehicle battery packs may be provided according to any number of different embodiments, may be connected in any number of different configurations, and may include any number of different sub-components, like sensors, control units, and/or any other suitable components known in the art.

In an exemplary embodiment, battery system 12 further comprises one or more balancing/sensing circuits 28. Each balancing/sensing circuit 28 provides an electrical path that allows for the shunting and electrical parameter measuring/sensing of a corresponding battery cell during, for example, the performance of diagnostic and/or cell balancing operations thereon. In an exemplary embodiment, battery system 12 includes a plurality of balancing/sensing circuits 28—one circuit 28 for each cell 34 (e.g., in the embodiment illustrated in FIG. 2, each circuit $28_1$-$28_4$ corresponds to a respective one of cells $34_1$-$34_4$). As illustrated in FIG. 2, each balancing/sensing circuit 28 comprises a balancing switch 36, a balancing resistive element 38 electrically connected in series with balancing switch 36, a voltage sensor 40, and a pair of sense wires 42 (e.g., two of sense wires $42_1, 42_2 \ldots 42_N$). As illustrated in FIG. 2, sense wires 42 electrically connect sensor 40 and the series combination of balancing switch 36 and balancing resistive element 38 in parallel with both a corresponding cell 34 and each other.

For example, and with reference to FIG. 2, balancing/sensing circuit $28_1$ comprises, at least in part, sensor $40_1$ and the series combination of balancing switch $36_1$ and resistive element $38_1$ (having a value of $R_{B1}$), both of which are connected between sense wires $42_1$, $42_2$. If balancing switch $36_1$ is in an "open" or "off" state, current does not flow from cell $34_1$ through balancing resistor $38_1$ and balancing switch $36_1$, and sensor $40_1$ is operative to measure the voltage of cell $34_1$. If, on the other hand, balancing switch $36_1$ is in the "closed" or "on" state during, for example, a cell balancing operation performed on cell $34_1$, current flows from cell $34_1$ and through the combination of sense wire $42_1$, resistive element $38_1$, switch $36_1$, and sense wire $42_2$, thereby bleeding off excess charge from the cell $34_1$ and reducing the output voltage of the cell (i.e., reducing the voltage of cell $34_1$ as part of a balancing operation). In such an instance, sensor $40_1$ is operative to measure the voltage applied across the combination of balancing switch $36_1$ and balancing resistive element $38_1$ by cell $34_1$. Similarly, cell balancing/sensing circuit $28_2$ comprises, at least in part, sensor $40_2$ and the series combination of balancing switch $36_2$ and resistive element $38_2$ (having a value of $R_{B2}$), both of which are connected between sense wires $42_2$, $42_3$. As with switch $36_1$, if balancing switch $36_2$ is in an "open" or "off" state, sensor $40_2$ is operative to measure the voltage of cell $34_2$; while if balancing switch $36_2$ is in a "closed" or "on" state, current flows from cell $34_2$ and through the combination of sense wire $42_2$, resistive element $38_2$, switch $36_2$, and sense wire $42_3$, and sensor $40_2$ is operative to measure the voltage across the combination of balancing switch $36_2$ and balancing resistive element $38_2$. It will be appreciated that the same concept applies to the other battery cells 34 and cell balancing/sensing circuits 28 of battery system 12 so that during a cell balancing operation, the voltage of cells having excess charge may be reduced so as to balance the cells of the battery pack.

As illustrated in FIG. 2, it will be appreciated that in certain embodiments, multiple balancing/sensing circuits 28 may share a sense wire 42. For instance, in the examples provided above, circuits $28_1$, $28_2$ share sense wire $42_2$. It will be further appreciated that each sense wire 42 may be comprised of a number of segments that serve to connect various components of battery system 12 together. For example, one segment of a sense wire 42 may connect a battery cell 34 with a corresponding balancing resistive element/balancing switch combination, another segment may connect the balancing resistive element/balancing switch combination to a sensor 40, etc. Additionally, while sense wires 42 are referred to herein as "wires," it will be appreciated that the present disclosure is not meant to be limited to sense wires in the form of traditional wires; rather, sense wires 42 may take the form of any number of electrical connections or conductors, such as, for example, electrical traces on a printed circuit board (PCB), each of which remains within the spirit and scope of the present disclosure.

Balancing switches 36 may comprise any type of electrical component that is configured to selectively make and break an electrical circuit. Switches 36 may operate in one of two states—a "closed" or "on" state, where electricity flows between the terminals of the switch; or an "open" or "off" state, where electricity does not flow. As shown in the embodiment illustrated in FIG. 2, each switch 36 is electrically connected to battery control module 30, or another suitable component (e.g., control module 22) and is configured to receive a control signal therefrom that controls the state of the switch to turn it "on" or "off." Examples of suitable switches include, but are not limited to, various types of transistors, such as, for example, bipolar junction transistor (BJTs) and all types of field-effect transistors (FETs), such as, for example, metal-oxide-semiconductor field-effect transistors (MOSFETs) and junction gate field effect transistors (JFETs). Accordingly, it will be appreciated that balancing switches 36 are not limited to any particular switch or type of switch. In one exemplary embodiment, however, each switch 36 comprises MOSFET type switch.

Balancing resistive elements 38 may comprise any suitable electrical component or combination of components having an appropriate resistance value. In an exemplary embodiment, each resistive element 38 comprises a single resistor; however, in other exemplary embodiments, one or more resistive elements 38 may comprise two or more resistors, a combination of resistor(s) and other electrical components, or suitable electrical component(s) other than resistors. The particular value of the resistive element 38 may be dictated by, for example, the desired magnitude of the balance current that is to flow through the balancing/sensing circuit 28 during a balancing operation being performed on a corresponding battery cell 34. Accordingly, it will be appreciated that balancing resistive elements 38 are not limited to any particular construction or value. In one exemplary embodiment, however, each resistive element 38 is comprised of a single resistor having a nominal value on the order of $R_B$=0-100Ω, and in one particular embodiment, a value of $R_B$=10Ω. For purposes of clarity and illustration, the value $R_B$ is intended to represent not only the resistance of resistive element 38, but also that of the balancing switch, which may be negligible. Therefore, for purposes of this disclosure, $R_B$ is intended to represent the effective balancing resistance of the balancing/sensing circuit.

Voltage sensors 40 may include any variety of different sensing components or elements. As described above, in an exemplary embodiment, each sensor 40 is part of a respective balancing/sensing circuit 28. In other exemplary embodiments, however, sensors 40 may be part of other components of battery system 12 (e.g., battery control module 30) or may be separate and distinct components of battery system 12. As such, sensors 40 may be integrated within the battery system 12 or battery pack 26 (e.g., an intelligent or smart battery), may be externally located outside the battery system 12 or pack 26, or may be provided according to some other known arrangement. In the exemplary embodiment illustrated in FIG. 2, each sensor 40 is configured to monitor, sense, detect, measure, or otherwise determine the voltage applied by a corresponding individual battery cell 34. It will be appreciated, however, that in other exemplary embodiments remaining within the spirit and scope of the present disclosure, sensors 40 may be configured to monitor, sense, detect, measure, or otherwise determine the voltage applied by multiple cells 34, either on a cell-by-cell basis or on a group basis, as opposed to being dedicated to one particular cell 34. In any event, and as shown in FIG. 2, sensors 40 may be electrically connected to (e.g., by a wired or wireless connection), and configured for communication with, battery control module 30 such that measurements made or taken by sensors 40 may be received by battery control module 30. In other exemplary embodiments, the sensors 40 may be electrically connected to, and configured for communication with, other suitable components, such as, for example, control module 22 or another suitable device, and such embodiments remain within the spirit and scope of the present disclosure.

In addition to the components of battery system 12 and balancing/sensing circuits 28 described above, in an exemplary embodiment, each sense wire 42 includes a resistive element 44 ("series resistive element 44") having a value of $R_s$. As with balancing resistive elements 38 described above, series resistive elements 42 may comprise any suitable electrical component or combination of components having an appropriate resistance value R. In an exemplary embodiment, each resistive element 44 comprises a single resistor; however, in other exemplary embodiments, one or more resistive elements 44 may comprise two or more resistors, a combination of resistor(s) and other electrical components, or suitable electrical component(s) other than resistors. The particular value of the resistive element(s) 44 may be dictated by, for example, the desired voltage drop that occurs when a corresponding balancing switch 36 is in the "on" state (which will be described in greater detail below), the desired magnitude of the balance current that will flow through the balancing/sensing circuit 28 when the balancing switch 36 thereof is in the "on" state, etc. Accordingly, it will be appreciated that balancing resistive elements 44 are not limited to any particular construction or value. In one exemplary embodiment, however, each resistive element 44 is comprised of a single resistor having a value on the order of $R_s$=0-100Ω (e.g., 5Ω).

One purpose of including series resistive elements 44 in sense wires 42 in the manner illustrated in FIG. 2 is to allow for battery control module 30, or another suitable component (e.g., control module 22) to diagnose or determine whether a particular balancing switch 36 electrically connected between a given pair of sense wires 42 is operational (i.e., the switch is in the "on" or "off" state when it is supposed to be).

More particularly, when a balancing switch 36 is in the "closed" or "on" state, the combination of the corresponding balancing resistive element 38 and the series resistive element(s) 44 of the sense wires 42 between which the balancing switch 36 is connected, serve to create a voltage divider within the balancing/sensing circuit 28. The voltage divider results in a voltage drop in the circuit as compared to when the balancing switch 36 is in an "open" or "off" state, and causes a corresponding sensor 40 connected across the combined balancing switch/balancing resistive element to sense or measure a voltage ("$V_{measured}$") that is lower than both the nominal and actual voltage of the cell 34 corresponding to the closed balancing switch 36

$$\left(\text{i.e., } V_{measured} = V_{cell\_actual} * \left(\frac{R_B}{(R_S + R_S) + R_B}\right)\right),$$

in the illustrated embodiment). The approximate magnitude of the decrease or drop in the voltage is generally predictable due to the known parameters of the circuitry, such as, for example, the nominal voltage of the cell and the nominal values of the resistive elements 38, 44. As such, when a particular balancing switch 36 is commanded to assume a "closed" or "on" state during, for example, a cell balancing or diagnostic operation, if the voltage measured by the corresponding sensor 40 is sufficiently below the nominal or actual voltage of the cell across which the balancing switch is connected (i.e., within a predictable range below the nominal or actual cell voltage) a determination or diagnosis may be made that the balancing switch 36 is operational. Alternatively, if the measured voltage is either equal to, above, or within a predetermined range below the nominal voltage of the cell, a determination or diagnosis may be made that the balancing switch 36 is not operational. In such a scenario, a diagnostic code or flag may be set, or some other indication of the potential problem may be provided.

For example, when balancing switch $36_1$ is in the "closed" state, the voltage sensed/measured by sensor $40_1$ ("$V_{measured}$") will not be the actual voltage ("$V_{cell\_actual}$") of cell $34_1$ (due to the voltage divider created by the series combination of resistive elements $38_1$ ($R_{B1}$), $44_1$ ($R_{S1}$), and $44_2$ ($R_{S2}$)); rather it will be:

$$V_{measured} = V_{cell\_actual} * \left(\frac{R_{B1}}{(R_{S1} + R_{S2}) + R_{B1}}\right).$$

Accordingly, when battery control module 30, for example, receives a voltage signal that is representative of such a value—which may reflect a predicted voltage drop in view of the known nominal voltage of the cell and nominal values of the resistive elements of the corresponding balancing/sensing circuit—it may diagnose or determine that switch $36_1$ is operational; otherwise it may diagnose or determine that it is not.

As will be described in greater detail below, one drawback of systems such as that described above is that due to the operation of the voltage divider in the balancing/sensing circuit, voltage measurements for a particular cell taken while a balancing switch corresponding thereto is in the "closed" or "on" state do not accurately reflect the actual voltage of cell. As such, other than using such cell voltage measurements for diagnosing whether a balancing switch is operational (as described above), the measured cell voltages cannot be used for virtually any other useful purposes such as, for example, those relating to cell balancing operations. As will be appreciated in view of the description below, one purpose of the present method is to address this drawback.

Battery control module 30 may include any variety of electronic processing devices, memory or storage devices, input/output (I/O) devices, and any other known components, and may perform various control, monitoring, and/or communication related functions. For example, battery control module 30 may be configured to control the state (i.e., "on" or "off") of the balancing switches 36 of the balancing/sensing circuits 28 described above. Battery control module 30 may be further configured to receive sensor signals from voltage sensors 40 and/or other various battery sensors 32, and to evaluate, analyze, and/or process those signals in an effort to control or monitor one or more aspects of the battery system 12, such as, for example, controlling the balancing of cells 34 of battery pack 26, diagnosing whether the balancing switches 36 of system 12 are operational, etc. In one example, battery control module 30 receives and packages sensor signals into a sensor message, and then sends the message to control module 22 or some other device over a suitable connection, such as a CAN bus, a system management bus (SM-Bus), a proprietary communication link, etc. It is possible for battery control module 30 to gather battery sensor readings and store them in local memory along with pertinent battery characteristics and background information pertaining to the battery's cell chemistry, cell capacity, upper and lower battery voltage limits, battery current limits, battery temperature limits, temperature profiles, battery impedance, number or history of charge/discharge events, etc. Additionally, in an exemplary embodiment, battery control module 30 is configured to carry out or perform one or more steps of the present method described in greater detail below. It should be appreciated that battery control module 30 may be a stand-alone electronic module, may be incorporated or included within another electronic module in the vehicle (e.g., control module 22), may be part of a larger network or system, may be located within the vehicle battery pack 26, or may be external to the battery pack 26, to name a few possibilities. Additionally, it will be appreciated that battery control module 30 is not limited to the schematic illustration shown in FIGS. 1 and 2 and described above. Further, in an exemplary embodiment, rather than voltage sensors being constituent components of the balancing/sensing circuits of the battery system, as described above, they may be part of the battery control module, as may other battery sensors such as those described below.

In addition to the components/devices described above, in an exemplary embodiment, battery system 12 may further include one or more battery sensors 32. Sensors 32 may include any variety of different sensing components or elements, and may monitor a variety of battery-related parameters or conditions such as voltage, current, SOC, state-of-health (SOH), temperature of the battery pack, etc. Battery sensors 32 may include sensors that are integrated within the battery system 12 or battery pack 26 (e.g., an intelligent or smart battery), are externally located outside the battery system 12 or pack 26, or are provided according to some other known arrangement. Battery sensors 32 may monitor, sense, detect, measure, or otherwise determine battery-related parameters or conditions on a cell-by-cell basis, as an average of a collection or block of cells or region of the battery pack 26, as an average of the entire battery pack 26, or according to some other method known in the art. In an exemplary embodiment, battery sensors 32 may include one or more voltage sensors for sensing individual battery cell voltages, and any number of other sensors known in the art (e.g., temperature sensors, current sensors, etc.). As with voltage sensors 40 described above, battery sensors 32 may be electrically connected (e.g., by a wired or wireless connection) to, and configured for communication with, battery control module 30, control module 22, and/or any other suitable device.

Electric motor 14 may use electrical energy stored in vehicle battery pack 26 to drive one or more vehicle wheels, which in turn propels the vehicle. While FIG. 1 schematically depicts electric motor 14 as a single discrete device, the electric motor may be combined with a generator (a so-called "mogen") or it may include multiple electric motors (e.g., separate motors for the front and rear wheels, separate motors for each wheel, separate motors for different functions, etc.), to cite a few possibilities. Vehicle 10 is not limited to any one particular type of electric motor, as many different motor types, sizes, technologies, etc. may be used. In one example, electric motor 14 includes an AC motor (e.g., a multi-phase induction motor, etc.), as well as a generator that can be used during regenerative braking. Electric motor 14 may be provided according to any number of different embodiments (e.g., AC or DC motors, brushed or brushless motors, permanent magnet motors, etc.), it may be connected in any number of different configurations, and it may include any number of different components, like cooling features, sensors, control units, and/or any other suitable components known in the art.

Inverter/converter 16 may act as an intermediary between vehicle battery system 12 and electric motor 14, as these two devices are oftentimes designed to function according to different operational parameters. For example, during vehicle propulsion, inverter/converter 16 may step-up the voltage from battery system 12 and convert the current from DC to AC in order to drive electric motor 14, while during regenerative braking, the inventor/converter may step-down the voltage generated by a braking event and convert the current from AC to DC so that it can be properly stored by the battery system. In a sense, the inverter/converter 16 manages how these different operational parameters (i.e., AC versus DC, various voltage levels, etc.) work together. Inverter/converter 16 may include an inverter for DC to AC conversion, a rectifier for AC to DC conversion, a step-up converter or transformer for increasing the voltage, a step-down converter or transformer for decreasing the voltage, other suitable energy management components, or some combination thereof. In the exemplary embodiment shown, inverter/converter units are integrated into a single bi-directional device; however, other embodiments are certainly possible. It should be realized that inverter/converter 16 may be provided according to any number of different embodiments (e.g., with separate inverter and converter units, bidirectional or unidirectional, etc.), may be connected in any number of different configurations, and may include any number of different components, like cooling systems, sensors, control units, and/or any other suitable components known in the art.

Engine 18 may drive generator 20 using conventional internal combustion techniques, and may include any suitable type of engine known in the art. Some examples of suitable engines include gasoline, diesel, ethanol, flex-fuel, naturally aspirated, turbo-charged, super-charged, rotary, Otto-cycle, Atkins-cycle, and Miller-cycle engines, as well as any other suitable engine type known in the art. According to the specific embodiment shown here, engine 18 is a small fuel-efficient engine (e.g., a small displacement, turbo-charged four-cylinder engine) that uses its mechanical output to turn generator 20. Skilled artisans will appreciate that engine 18 may be provided according to any number of different embodiments, may be connected in any number of different configurations (e.g., engine 18 could be part of a parallel hybrid system where the engine is also mechanically coupled to the vehicle wheels instead of exclusively being used to generate electricity), and may include any number of different components, like sensors, control units, and/or any other suitable components known in the art.

Generator 20 is mechanically coupled to engine 18 so that the mechanical output of the engine causes the generator to create electrical energy that may be provided to the vehicle battery system 12, the electric motor 14, or both. It is worth noting that generator 20 may be provided according to any number of different embodiments (e.g., the generator of motor 14 and generator 20 may be combined into a single unit), may be connected in any number of different configurations, and may include any number of different components, like sensors, control units, and/or any other suitable components known in the art. Generator 20 is not limited to any specific generator type or embodiment.

Control module 22 may be used to control, govern, or otherwise manage certain operations or functions of vehicle 10 and/or one or more components or modules thereof (e.g., battery system 12). In an exemplary embodiment, control module 22 includes a processing device 46 and a memory device 48. Processing device 46 may include any type of suitable electronic processor (e.g., a microprocessor, a microcontroller, an application specific integrated circuit (ASIC), etc.) that executes instructions for software, firmware, programs, algorithms, scripts, etc. This processor is not limited to any one type of component or device. Memory device 48 may include any type of suitable electronic memory means and may store a variety of data and information. This includes, for example: sensed and/or measured battery-related conditions; values of battery-related parameters; look-up tables and other data structures; software, firmware, programs, algorithms, scripts, and other electronic instructions; component characteristics (e.g., values of components of battery system 12, such as, for example, values of resistive elements of balancing/sensing circuits of battery system 12); etc. The present method—as well as any other electronic instructions and/or information needed for such tasks—may also be stored or otherwise maintained in memory device 48 such that control module 22 may be configured to perform one or more steps of the method described in greater detail below. Control module 22 may be electrically connected to other vehicle devices and modules (e.g., battery control module 30) via I/O devices and suitable connections, like a communications bus, so that they can interact as required. These are, of course, only some of the possible arrangements, functions, and capabilities of control module 22, as others are certainly possible. Depending on the particular embodiment, control module 22 may be a stand-alone electronic module (e.g., a vehicle integration control module (VICM), a traction power inverter module (TPIM), a battery power inverter module (BPIM), etc.), it may be incorporated or included within another electronic module in the vehicle (e.g., a power train control module, an engine control module, a hybrid control module, the battery control module 30, etc.), or it may be part of a larger network or system (e.g., a battery management system (BMS), a vehicle energy management system, etc.), to name a few possibilities.

Again, the preceding description of exemplary hybrid electric vehicle 10 and the drawing in FIG. 1 are only intended to illustrate one potential vehicle arrangement and to do so in a general way. Any number of other vehicle arrangements and architectures, including those that differ significantly from the one shown in FIG. 1, may be used instead.

Figure 3:
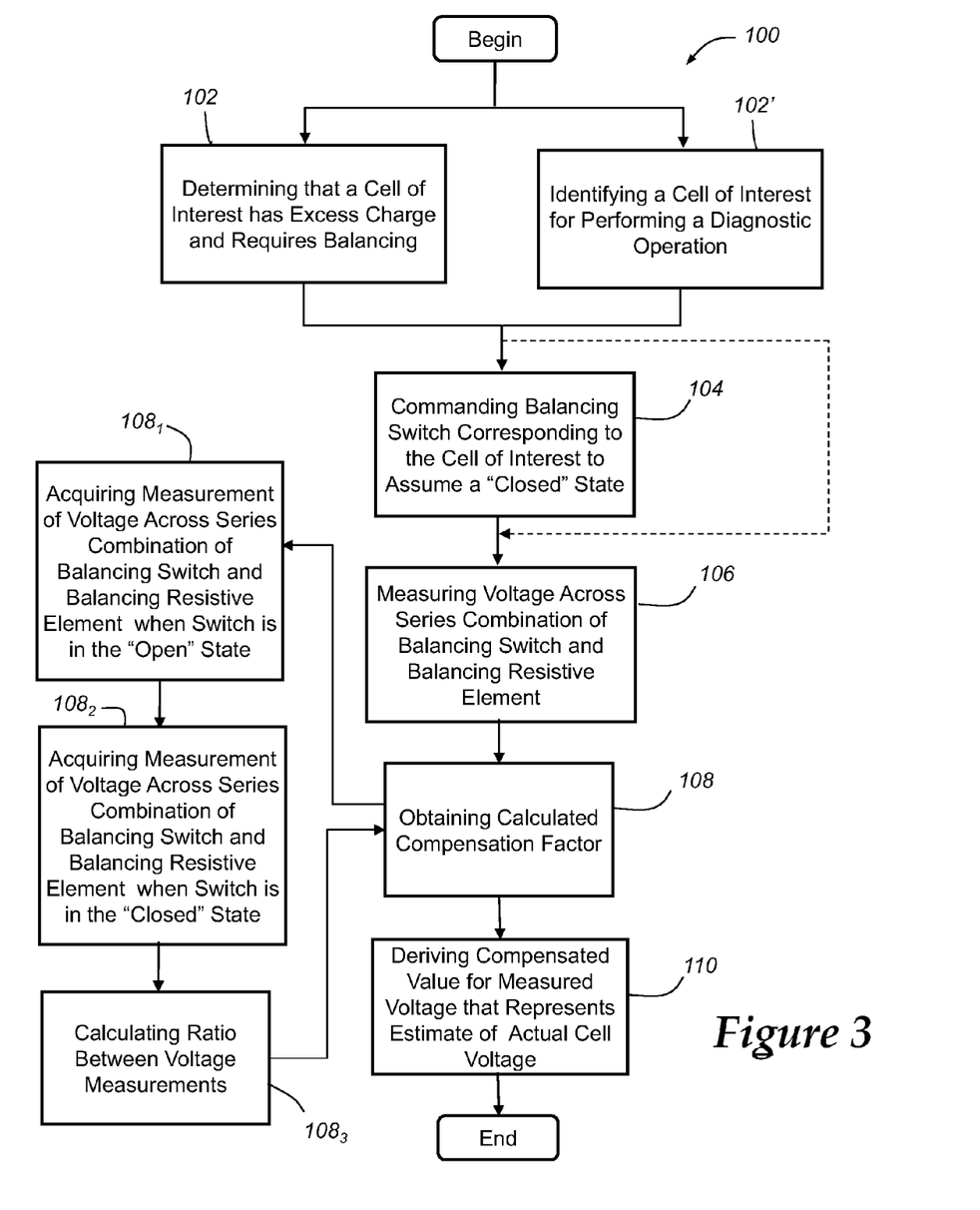
FIG. 3 is a flowchart showing some of the steps of an exemplary method for estimating the voltage of a battery element, such as an individual battery cell, that may be used with a battery system, such as that illustrated in FIG. 2.

Turning to FIG. 3, there is shown an exemplary method 100 for estimating the voltage of a battery element, such as, for example and without limitation, an individual cell of battery pack of a battery system (e.g., a cell 34 of battery pack 26 of battery system 12 described above) when a balancing switch corresponding thereto is in a "closed" or "on" state (e.g., during a balancing operation being performed on the battery element or a diagnostic operation being performed on the balancing switch, for example). More particularly, method 100 is directed to a method for estimating the voltage of a battery element having a balancing/sensing circuit electrically connected thereto that comprises a series combination of a balancing switch and a balancing resistive element electrically connected in parallel with the battery element, and in which a voltage divider is formed when the balancing switch is in the "closed" or "on" state. A non-limiting example of such a circuit is balancing/sensing circuit 28 described above.

It will be appreciated that while the description below is primarily with respect to the use of the present method to estimate the voltage of a battery element comprising an individual battery cell, the present disclosure is not meant to be so limited. Rather, those of ordinary skill in the art will appreciate that the present method may be used to estimate the voltage of any number of other battery elements, such as, for example, a portion of a battery pack, a group of cells in a battery pack, a block of cells in a battery pack, etc. Accordingly, the present disclosure is not limited to any one particular type of battery element.

Further, while the methodology is primarily described herein as being performed on a cell-by-cell or a "one cell at a time" basis, the present disclosure is not meant to be so limited. Rather, in various embodiments, the voltage of multiple cells may be estimated contemporaneously by performing the present methodology for each desired cell of interest. One possible limitation of estimating the voltage of multiple cells at the same or substantially the same time is that in certain embodiments, such as, for example, that illustrated in FIG. 2, the balancing switches corresponding to adjacent cells should not be operated in the "on" state at the same time in order to prevent the estimation of the voltage of one cell from being adversely impacted by the voltages of adjacent cell(s). Accordingly, in an exemplary embodiment, such as, for example, that wherein balancing switches $36_1$ and $36_3$ are "closed," and switches $36_2$ and $36_4$ are "open," only non-adjacent balancing switches should be in the "closed" or "on" state at the same time.

With reference to FIG. 3, in an exemplary embodiment, method 100 comprises a step 102 of determining, as part of a cell balancing operation, whether a particular cell of interest has excess charge, and therefore, requires balancing. Step 102 may be performed in a number of ways. In one exemplary embodiment, the voltage applied by the cell across the series combination of a balancing switch and a balancing resistive element of a balancing/sensing circuit corresponding thereto may be measured when the balancing switch is in an "open" or "off" state. The measured voltage may then be used to determine whether the cell requires balancing.

For example, and with reference to FIG. 2 wherein cell $34_1$ is considered to be a cell of interest, the voltage applied by cell $34_1$ across the serial combination of balancing switch $36_1$ and balancing resistive element $38_1$ when balancing switch $36_1$ is "open" or "off" may be measured by sensor $40_1$. That measured voltage may then be used by battery control module 30 or another suitable component (e.g., control module 22) to determine whether cell $34_1$ has excess charge, and thus, whether cell $34_1$ requires balancing. It will be appreciated that in other exemplary embodiments, techniques other than that described above for determining whether a particular cell requires balancing may be used, and such techniques remain within the spirit and scope of the present disclosure.

In another exemplary embodiment, rather than determining whether a particular cell of interest requires balancing as part of a cell balancing operation, step 102 (i.e., step 102' in FIG. 3) may comprise identifying a cell of interest for which a diagnostic operation is to be performed. More particularly, in an exemplary embodiment, method 100 may be used, at least in part, for diagnostic purposes in order to diagnose whether a balancing switch corresponding to a particular cell is operational (e.g., whether a balancing switch turns "on" or "closes" in response to a command to do so). This identifying step may be performed in a number of ways, such as, for example: in accordance with a predetermined testing sequence wherein one or more balancing switches are tested at a given time and/or in a given order; following a determination that the balancing switch of a particular cell may not be operating properly; or in any other way known in the art.

Whether it is determined that a particular cell of interest requires balancing to bleed off excess charge or, alternatively, is identified as one for which a diagnostic operation is to be performed, method 100 further comprises a step 104 of commanding the balancing switch corresponding to that particular cell of interest to "close" or turn "on" or, in other words, to assume the "closed" or "on" state. For instance, and with reference to FIG. 2, battery control module 30 or another suitable component (e.g., control module 22) may be configured to control the state of balancing switches 36. As such, battery control module 30 may be configured to provide an activation or enable signal to the appropriate balancing switch(es) 36 through, for example, corresponding switch control lines that electrically connect battery control module 30 and switches 36 together. Such activation or enable signals are intended to command and cause the appropriate switch(es) 36 to assume the "on" or "closed" state. Therefore, in an exemplary embodiment wherein cell $34_1$ is considered to be the cell of interest, battery control module 30 may provide an activation signal to balancing switch $36_1$ to cause it to assume a "closed" or "on" state. While the description above is directed to a particular way in which step 104 may be performed, it will be appreciated that the present disclosure is not meant to be so limited. Rather, skilled artisans will appreciated that step 104 may be performed in any number of ways using any number of devices or components, and such other ways of performing step 104 remain within the spirit and scope of the present disclosure. Additionally, it will be further appreciated that in certain embodiments, step 104 may be an optional step.

More particularly, if, for example, a balancing and/or diagnostic operation is already in process on the cell that is determined to require balancing or that is identified as a cell for which a diagnostic operation is to be performed in step 102/ 102,' the balancing switch corresponding to the cell of interest may already be in, or at least may be presumed to be in, the "closed" state. In such an instance, the balancing switch may not need to be commanded to assume the "closed" state, and thus, step 104 may not be required but rather method 100 may skip step 104.

Following the provision of the switching command in step 104 (or following step 102/102' in an instance wherein step 104 is not required), method 100 may further comprise a step 106 of measuring the voltage applied by the cell of interest across the presumably "closed" balancing switch, and, in an exemplary embodiment, the voltage applied across the series combination of the balancing switch and the balancing resistive element of the balancing/sensing circuit corresponding to the cell of interest. This measurement may be made or taken by a voltage sensor that is electrically connected across (in parallel with) the combination of the balancing switch and balancing resistive element, and that may or may not be part of the balancing/sensing circuit corresponding to the cell of interest. In addition to being connected in parallel with the balancing switch/balancing resistive element combination, in an exemplary embodiment, the voltage sensor may also be electrically connected (i.e., by a wired or wireless connection) to, for example, a battery control module or another suitable component that is configured to receive, and, in some instances, utilize, the voltage measurements taken or made by the voltage sensor.

For instance, and with reference to FIG. 2, in an exemplary embodiment wherein cell $34_1$ is considered to be a cell of interest, step 106 may comprise measuring, using voltage sensor $40_1$, the voltage applied by cell $34_1$ across the series combination of balancing switch $36_1$ and balancing resistive element $38_1$. In the illustrated embodiment, voltage sensor $40_1$ is electrically connected to battery control module 30, and therefore, an electrical signal representative of the measured voltage may be communicated to, and received by, battery control module 30. It will be appreciated that while in this exemplary embodiment, battery control module 30 is electrically connected to, and receives the measured voltage from, voltage sensor $40_1$, the present disclosure is not meant to be so limited. Rather, in other exemplary embodiments, suitable components other than battery control module 30 (e.g., control module 22) may be configured to perform this functionality, and such embodiments remain within the spirit and scope of the present disclosure.

As described more fully above, in an exemplary battery system such as that illustrated in FIG. 2, when the balancing switch of a balancing/sensing circuit of the battery system is in the "closed" or "on" state, a voltage divider is formed in the sensing circuit due to the inclusion of the series resistive element, or, in certain instances, multiple series resistive elements, disposed in one or more of the sense wire(s) of the balancing/sensing circuit. As such, a voltage measured across the balancing switch/balancing resistive element combination when the balancing switch is in the "closed" or "on" state is not representative of the actual voltage of the cell; rather the measurement reflects the voltage drop caused by the operation of the voltage divider, and thus, the measured voltage is a reduced or lowered voltage as compared to the actual cell voltage (i.e., $V_{measured} \neq V_{cell\_actual}$, rather $$V_{measured} = V_{cell\_actual} * \left(\frac{R_B}{R_S + R_B}\right)$$

wherein, $R_B$ is, as described above, the effective balancing resistance (i.e., combined resistance of the balancing resistive element and the balancing switch), and $R_S$ is the resistance value of the series resistive element of the balancing/sensing circuit, and further wherein, in certain embodiments, such as that illustrated in FIG. 2, $R_S$ equals the sum of the values of the series resistive elements in the given balancing/sensing circuit).

This reduced voltage value may be useful for certain purposes, such as, for example, diagnosing whether the balancing switch is operational (i.e., if the voltage is sufficiently below the nominal or actual voltage of the cell (e.g., within a predictable range below the nominal or actual cell voltage) a determination may be made that the balancing switch is in the "closed" or "on" state, and therefore, is operational; conversely, if the voltage is either equal to, above, or within a predetermined range below the nominal or actual voltage of the cell, a determination may be made that the balancing switch is not in the "closed" or "on" state, and therefore, is not operational). As described above, however, it also renders the measured voltage effectively useless for other purposes, such as, for example, in the controlling of a cell balancing operation. More particularly, because the measured voltage is not an accurate representation of the actual cell voltage, the availability of useful information and the speed at which such information can be obtained, as well as the sophistication and speed of controls that use such information, is adversely impacted by the reduced voltage, as the cell balancing operation must wait until the balancing switch is in an "open" or "off" state to obtain accurate and useful voltage readings.

In view of this, method 100 may provide for the compensation of the voltage drop in the balancing/sensing circuit occurring when the balancing switch is in the "closed" or "on" state in order to estimate the actual voltage of the cell. More particularly, in an exemplary embodiment, method 100 may comprise a step 108 of obtaining a compensation factor that accounts for the voltage drop in the balancing/sensing circuit described above, and a step 110 of using the obtained compensation factor to derive a compensated value for the voltage measured in step 106, wherein the compensated value compensates for the voltage drop and represents an estimate of the actual voltage of the cell.

In an exemplary embodiment, the compensation factor obtained in step 108 is a calculated compensation factor calculated from measurement(s) of one or more electrical parameters of the balancing/sensing circuit corresponding to the cell of interest (opposed to being empirically derived during, for example, the manufacture of the battery system), and it may be obtained in a number of ways. For instance, in an exemplary embodiment, the compensation factor may be obtained by calculating it each time a cell voltage estimate is desired or needed. In another exemplary embodiment, the compensation factor may be pre-calculated or predetermined (e.g., following step 104 and prior to step 106) and may be retrieved or acquired from a memory device in which it is stored each time a cell voltage estimate is desired or needed between the time the compensation factor was calculated (e.g., when the balancing switch was first "closed") and the time at which the balancing switch changes from a "closed" state to an "open" state. Accordingly, the compensation factor may be obtained in a number of ways, including suitable ways other than those described above, each of which remains within the spirit and scope of the present disclosure. In any event, and as will be described in greater detail below, once the compensation factor has been obtained, it may be applied (step 110) to the voltage measured in step 106 in order to estimate the voltage of the cell of interest.

While the particular form of the compensation factor may vary, in an exemplary embodiment, the compensation factor comprises a value that is calculated using, at least in part, measurements relating to the balancing/sensing circuit corresponding to the cell of interest taken or made by one or more sensors (e.g., sensors of balancing/sensing circuit or otherwise) at one or more different points in time. For example, in an exemplary embodiment, the compensation factor may take the form of a ratio of measured voltages ("voltage ratio"). More particularly, and with reference to FIG. 4, the compensation factor may comprise a voltage ratio between a measurement of the voltage applied across the balancing switch/balancing resistive element combination of the balancing/sensing circuit of a cell of interest when the balancing switch is in an "open" or "off" state (represented in FIG. 4 as "$V_1$" taken at time $t=t_0$), and a measurement of the voltage applied across the balancing switch and resistive element when the balancing switch is in a "closed" or "on" state (represented in FIG. 4 as "$V_2$" taken at time $t=t_1$), which may comprise the voltage measured in step 106 or an earlier measured voltage, such as, for example, a voltage measurement taken immediately following the closing of the switch. Accordingly, in such an embodiment, step 108 may comprise obtaining the compensation factor in the form of a voltage ratio by either computing or calculating it based on voltage measurements taken before and after a time at which the balancing switch is "closed," or by acquiring or retrieving a ratio calculated or determined at a previous point in time, such as, for example, when the balancing switch first assumed the "on" or "closed" state, from a memory device in which it is stored.

Once the compensation factor has been obtained, it may be applied in step 110 to the voltage measured in step 106 to derive a compensated value for the measured voltage that represents an estimate of the actual voltage of the cell. As with obtaining step 108, the compensation factor may be applied to the measured voltage in any number of ways. For instance, in one non-limiting example, the compensation factor is applied by multiplying the measured voltage by the compensation factor. Accordingly, in the embodiment wherein the compensation factor comprises the voltage ratio described above, the voltage measured in step 106 may be multiplied by the ratio obtained in step 108 to derive a compensated value of the voltage, and therefore, estimate the actual voltage of the cell of interest.

Figure 4:
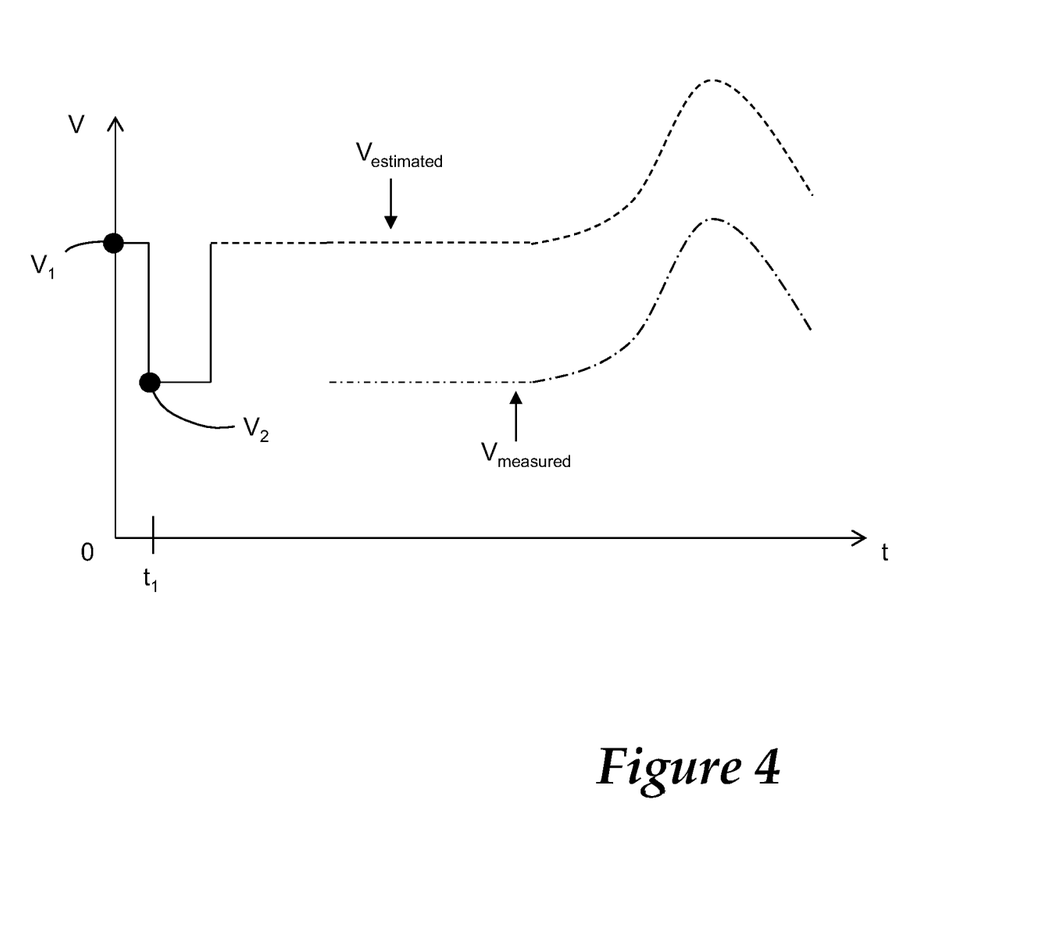
FIG. 4 is a graphical representation illustrating the measured voltage response to a balancing switch of the battery system illustrated in FIG. 2 assuming a "closed" or "on" state in order to help illustrate the method depicted in FIG. 3.

For instance, and with reference to FIGS. 2-4, assume that battery cell $34_1$ is a cell of interest and that the compensation factor to be utilized is the particular voltage ratio described above. In an exemplary embodiment, step 108 of obtaining the compensation factor comprises a first substep $108_1$ of acquiring a measurement of the voltage across the combination of balancing switch $36_1$ and balancing resistive element $38_1$ when balancing switch $36_1$ is in an "open" or "off" state (i.e., "$V_1$" in FIG. 4), and a second substep $108_2$ of acquiring a measurement of the voltage across the combination when balancing switch $36_1$ is in the "closed" or "on" state (i.e., "$V_2$" in FIG. 4). It will be appreciated that when the balancing switch is "closed" (i.e., time $t=t_1$ in step 104, for example), the voltage applied across the combination of balancing switch $36_1$ and resistive element $38_1$ drops due to the operation of the voltage divider created in the balancing/sensing circuit by balancing resistive element $38_1$ and series resistive elements $44_1$, $44_2$, and remains below the actual cell voltage while the balancing switch $36_1$ remains in the "closed" or "on" state. Accordingly, the voltage measurement made or taken in substep $108_1$ will be higher than that made or taken in sub step $108_2$.

With respect to substep $108_1$, the measurement of the voltage when balancing switch $36_1$ is in the "open" or "off" state may be acquired in a number of ways. For example, the measurement may be made or taken by a suitable sensor in response to the determination or identification made in step 102/102' described above, and, in an exemplary embodiment, may be done so just prior to commanding balancing switch $36_1$ to close in step 104. In such an embodiment, this measurement may be made or taken by sensor $40_1$, for example, and may be communicated to battery control module 30 or another suitable component (e.g., control module 22) where it may be stored in a memory device thereof or accessible thereby. Alternatively, in another exemplary embodiment, the measurement may be acquired from a memory device in which it is stored. More specifically, the measurement may be one that was made or taken at an earlier point in time and that may be acquired by battery control module 30 or another suitable component (e.g., control module 22) from the memory device in which it is stored (e.g., a memory device of or accessible by battery control module 30 or another suitable component). In such an embodiment, step $108_1$ may be performed before or after the balancing switch is commanded to close in step 104.

With respect substep $108_2$, the measurement of the voltage when balancing switch $36_1$ is in the "closed" or "on" state may be similarly acquired in a number of ways. For example, the measurement may be made or taken by a suitable sensor following step 104 in which the balancing switch $36_1$ was commanded to assume the "closed" or "on" state, and before step 106 in which the voltage across the balancing switch $36_1$ and balancing resistive element $38_1$ is measured. In such an embodiment, this measurement may be made or taken by sensor $40_1$, for example, and may be communicated to battery control module 30 or another suitable component (e.g., control module 22) where it may be stored in a memory device thereof or accessible thereby. In another exemplary embodiment, rather than making or taking two separate voltage measurements in substep $108_2$ and step 106, the voltage measurement from step 106 may be used for purposes of calculating the compensation factor, and therefore, substep $108_2$ may comprise acquiring the measurement made or taken in step 106 from a memory device in which it is stored. More particularly, the measurement from step 106 may be acquired by battery control module 30 or another suitable component (e.g., control module 22) from the memory device in which it is stored (e.g., a memory device of or accessible by battery control module 30 or another suitable component). Finally, in yet another exemplary embodiment, the measurement being acquired in substep $108_2$ may be one that was made or taken at an earlier point in time (e.g., at the time the balancing switch was closed) and that may be acquired by battery control module 30 or another suitable component (e.g., control module 22) from the memory device in which it is stored (e.g., a memory device of or accessible by battery control module 30 or another suitable component).

Once voltage measurements $V_1$ and $V_2$ have been acquired in substeps $108_1$, $108_2$, step 108 may further comprise another substep $108_3$ of calculating the compensation factor (e.g., voltage ratio) using those acquired voltage measurements. More particularly, in an exemplary embodiment, the compensation factor comprises the ratio between a voltage measurement corresponding to when the balancing switch $36_1$ is in the "open" or "off" state, and a measurement corresponding to when the balancing switch $36_1$ is in the "closed" or "on" state. As such, step $108_3$ comprises calculating the voltage ratio by dividing voltage measurement $V_1$ by voltage measurement $V_2$ $$\left(\text{i.e., } \frac{V_1}{V_2}\right).$$

This ratio may then be used to estimate the actual voltage of cell $34_1$ (i.e., "$V_{estimate}$") by multiplying the voltage measured in step 106 by the ratio $$\left(\text{i.e., } V_{estimate} = V_{measured} * \frac{V_1}{V_2}\right).$$

Accordingly, assuming for purposes of illustration that $V_1$=3.8V and $V_2$=1.9V, the voltage ratio would be 2.0 and it may be applied to the voltage measured in step 106 to estimate the actual cell voltage. So if the voltage measured in step 106 is 1.9V, the actual cell voltage may be estimated to be 3.8V (i.e., 1.9V*2=3.8V). In any event, the calculation and application of the ratio may be performed by, for example, any suitable component, such as, for example, battery control module 30, control module 22, or another suitable component.

It will be appreciated that while it may appear from the description of step 108 in the example above that the compensation factor (e.g., voltage ratio) is calculated or re-calculated each time an estimate of the actual cell voltage is needed or desired, the present disclosures is not meant to be so limited. Rather, in another exemplary embodiment, step 108 may comprise obtaining a previously calculated compensation factor from a memory device in which it is stored (e.g., a memory device of, or accessible by, battery control module 30; memory device 48 of control module 22; etc.), which may then be applied in step 110 to the voltage measured in step 106 in the same manner described above. Such an embodiment may be applicable in an instance where the compensation factor (e.g., the voltage ratio described above) was calculated just after balancing switch $36_1$ was "closed," but step 106 was performed some time later but before the state of switch $36_1$ changed to an "open" or "off" state. In such an instance, the previously calculated compensation factor may be obtained from a memory device and applied in step 110. For example, using the voltage ratio calculation described above, if the measured voltage $V_1$ was 3.8V prior to the balancing switch being closed, and 1.9V just after the balancing switch was closed, the ratio would be 2.0. If at some point following the closing of the balancing switch and while the switch remains closed, step 106 is performed and a voltage of 1.7V is measured, the actual cell voltage may be estimated to be 3.4V (i.e., 1.7V*2.0=3.4V), which would reflect that a certain amount of charge has been bled off cell $34_1$.

While the description above has been primarily with respect to an embodiment of a compensation factor that is derived from measurements of one or more electrical parameters of a balancing/sensing circuit corresponding to a cell of interest, and more particularly, to an embodiment wherein the compensation factor comprises a particular voltage ratio, the present disclosure is not meant to be limited to such an embodiment. Rather, skilled artisans will appreciate that ratios and/or other measurement-derived compensation factors in addition to, and/or other than, that described above may be used, and each such other compensation factor remains within the spirit and scope of the present disclosure.

Figure 5:
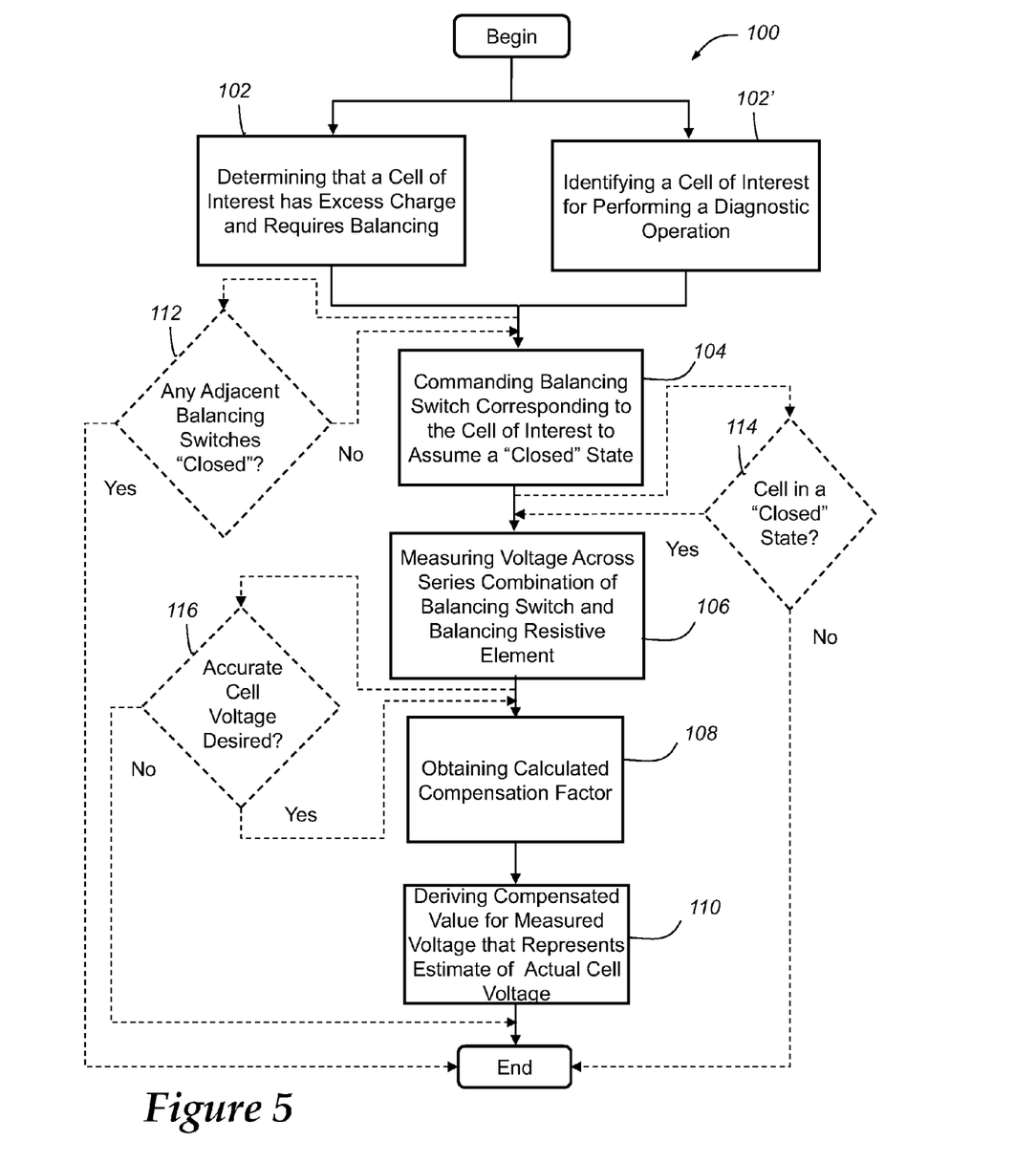
FIG. 5 is another flowchart showing some of the steps of an exemplary method for estimating the voltage of a battery element, including certain optional steps not shown in FIG. 3, that may be used with a battery system, such as that illustrated in FIG. 2.

With reference to FIG. 5, method 100 may further include one or more steps in addition to those steps described above, including, for example, those described below. It will be appreciated that one or more of these additional steps may be optional depending on the particular implementation of method 100. It will be further appreciated that certain portions/steps illustrated in FIG. 3 (substeps $108_1$-$108_3$ of step 108, for example) have been omitted in FIG. 5 for clarity purposes only.

For example, in certain instances, and as briefly described above, when the balancing switch corresponding to a cell of interest is in the "closed" or "on" state and the voltage of that cell is being estimated in the manner described above, the balancing switch(es) of the cell(s) adjacent to the cell of interest should not be operated in the "closed" or "on" state in order to prevent the voltages of adjacent cells interfering or adversely impacting the measurement and estimation of the voltage of a cell of interest. More particularly, balancing switches of adjacent cells that have balancing/sensing circuits that share a sense wire should not be operated in a "closed" or "on" state at the same time. Accordingly, in an exemplary embodiment, and prior to performing any one or more of steps 104, 106, 108 and/or 110 (e.g., prior to step 104 in FIG. 5), method 100 may further comprise a step 112 of determining whether any balancing switches that correspond to voltage cells adjacent to the cell of interest are currently in the "closed" or "on" state (i.e., determining whether any balancing switches adjacent to the balancing switch corresponding to the cell of interest are in the "closed" or "on" state). If it is determined that one or more adjacent balancing switches are, in fact, in the "closed" or "on" state, method 100 may simply end and not progress to any subsequent steps. Alternatively, and depending on when step 112 is performed relative to the other steps of method 100, the method may loop back to a previously performed step and the method may be repeated, at least in part. Conversely, if it is determined that no adjacent balancing switch is in a "closed" or "on" state, method 100 may proceed to the next step in the process, which, depending on the order in which the steps are performed, may comprise step 104, 106, 108, or 110.

For instance, and with reference to FIG. 2 wherein cell $34_1$ is considered to be a cell of interest, step 112 may comprise determining whether any balancing switch(es) 36 adjacent to balancing switch $36_1$ are currently in a "closed" or "on" state. In this particular embodiment, step 112 would comprise determining whether balancing switch $36_2$, which is the only switch adjacent to switch $36_1$, is in a "closed" or "on" state. If it is determined that balancing switch $36_2$ is in an "open" or "off" state, method 100 may progress to the next step of the process (e.g., step 104, 106, 108, or 110); otherwise, method 100 end or loop back to a previous step.

In an exemplary embodiment, step 112 may be performed by any component of the vehicle that is configured to control and monitor the state of each balancing switch of the battery system, and therefore, knows the state of each balancing switch. With respect to battery system 12 illustrated in FIGS. 1 and 2, in an exemplary embodiment, step 112 may be performed by battery control module 30 or another suitable component, such as, for example, control module 22. Accordingly, the present disclosure is not limited to any particular component performing step 112.

Another step that method 100 may include involves checking the state of the balancing switch corresponding to the cell of interest and that is presumed to be in the "closed" state, either in response to the command issued in step 104 or otherwise. More particularly, while it may be presumed that the balancing switch corresponding to the cell of interest is in the "closed" or "on" state following, for example, the command issued in step 104, in an exemplary embodiment, method 100 may comprise a step of verifying that the switch is, in fact, in a "closed" or "on" state prior to moving forward with subsequent steps of method 100. More particularly, in an exemplary embodiment, method 100 comprises a step 114 of determining whether the balancing switch commanded to be "closed" in step 104, or that is otherwise supposed to be "closed," is, in fact, in the "closed" or "on" state.

In an exemplary embodiment, the voltage measured in step 106 may be used to make this determination. For example, and as described elsewhere herein, if the measured voltage is sufficiently reduced or lower than either the nominal voltage of the cell or an expected actual voltage of the cell, a determination can be made that the switch is in a "closed" or "on" state; while if the measured voltage is approximately at an expected actual voltage of the cell, or at least above a certain predetermined magnitude, a determination can be made that the switch is not in a "closed" or "on" state. Accordingly, in such an embodiment, step 114 is performed following step 106; however, the present disclosure is not meant to be so limited. Rather, skilled artisans will appreciated that any number of techniques may be used to make the determination required in step 114, and that method 100 is not limited to any one particular sequence of steps. Accordingly, techniques for performing step 114 and sequences of method 100 other than that/those described above, remain within the spirit and scope of the present disclosure.

Regardless of whether the voltage measured in step 106 or some other technique known in the art is used to determine or verify the state of the balancing switch, if it is determined that the balancing switch is in the "closed" or "on" state, method 100 may progress to the next step of the process, which may comprise step 108 or 110, for example. Otherwise, method 100 may end and not progress to any subsequent steps, or alternatively, may loop back to a previously performed step of the method and the method may be repeated, at least in part. In an instance wherein the balancing switch is not in a "closed" or "on" state, step 114 may further comprise setting a diagnostic code or flag indicating that the switch may not be operating correctly.

For instance, and with reference to FIG. 2 wherein cell 34$_1$ is considered to be a cell of interest, step 114 may comprise determining whether balancing switch 36$_1$ is in a "closed" or "on" state following the command issued in step 104 to close switch 36$_1$. In such an embodiment, battery control module 30 or some other suitable component (e.g., control module 22) may be configured to evaluate the voltage measured in step 106 to determine whether the balancing switch 36$_1$ is in an "open" or "closed" state. If it is determined that balancing switch is, in fact, in a "closed" state, the method 100 may progress to the next step of the process (e.g., step 108 or 110); otherwise, method 100 may end or loop back to a previous step of the method.

In addition to the steps described above, another step that method 100 may include is a step 116 of determining whether an accurate estimate of the cell voltage is desired. More particularly, if a diagnostic operation is being performed where the actual cell voltage is not needed to carry out the operation, then steps 108 and/or 110 may not need to be performed and method 100 may either end or loop back to a previous step of the method. For example, if a diagnostic operation is being performed to only determine if a balancing switch is operational, the measured voltage across the balancing switch/balancing resistive element combination may be used solely to determine whether the switch is operating correctly and therefore, it may not be necessary to know the actual or approximate cell voltage. In such an instance, there is no need to estimate the actual cell voltage, and therefore, the method may end or loop back to a previous step. Alternatively, if is desirable to know the actual cell voltage, such as, for example, in an instance where a cell balancing operation is being performed, then it may be necessary for method 100 to estimate the actual cell voltage, and thus, method 100 may move on to step 108 or 110.

For example, and with reference to FIG. 2 wherein cell 34$_1$ is considered to be a cell of interest, a determination may be made by battery control module 30 or another suitable component (e.g., control module 22) as to whether it is desirable to known the actual voltage of cell 34$_1$. If so, method 100 may move on to step 108 or 110; if not, method 100 may end or loop back to a previous step.

In the exemplary embodiment described above, step 116 is performed following step 106 and prior to steps 108 and/or 110. It will be appreciated, however, that the present disclosure is not meant to be limited to such a sequence of steps; rather step 116 may be performed at any point during the performance of method 100 before step 106, and therefore, method 100 is not limited to any one particular sequence of steps.

It will be appreciated by those having ordinary skill in the art that while the description above has primarily been with respect to a battery element, the present system and method may also find application with a number of energy storage or distribution devices or systems other than that or those described above. These other devices or systems may include, for example and without limitation: capacitor banks; ultracapacitors; 1-cell battery packs; or any other device or system that dissipates energy with resistors and has a series sense line/power path impedance, and that also has an "off" state that cannot be measured all the time to get the true value of the source voltage, and "on" state wherein the voltage must be compensated to get the true value.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Further, the term "electrically connected" and the variations thereof is intended to encompass both wireless electrical connections and electrical connections made via one or more wires, cables, or conductors (wired connections). Other terms are to be construed using their broadest reasonable meaning unless they are used in a context that requires a different interpretation.

The invention claimed is:

1. A method for estimating the voltage of a battery element of a vehicle battery system, the method comprising the steps of:
    providing a balancing/sensing circuit having a series resistive element and a series combination of a balancing switch and a balancing resistive element electrically connected in parallel with the battery element;
    measuring the voltage across the combination of the balancing switch and balancing resistive element when the balancing switch is presumed to be in a "closed" state; and
    deriving a compensated value for the measured voltage by applying a calculated compensation factor to the measured voltage, wherein the compensated value compensates for a voltage drop associated with the series resistive element that occurs in the balancing/sensing circuit when the balancing switch is in the "closed" state and the compensated value represents an estimate of the actual voltage of the battery element, and further wherein the calculated compensation factor is derived from measurement(s) of one or more electrical parameters relating to the balancing/sensing circuit.

2. The method of claim 1, wherein the calculated compensation factor is a ratio of voltage measurements respectively taken across the combination of the balancing switch and balancing resistive element when the balancing switch is in an "open" state ("$V_1$") and when the balancing switch is in a "closed" state ("$V_2$"), the voltage ratio comprising $$\left(\frac{V_1}{V_2}\right);$$

and further wherein the deriving step comprises applying the voltage ratio by multiplying the measured voltage by the voltage ratio.

3. The method of claim 1, further comprising the step of verifying that the balancing switch is in the "closed" state prior to deriving a compensated value for the measured voltage, and wherein the deriving step is performed only after the "closed" state of the balancing switch has been verified.

4. The method of claim 3, wherein the verifying step is performed following the measuring step and before the deriving step and comprises evaluating the measured voltage.

5. The method of claim 1, further comprising the step of determining whether the balancing switches of any balancing/sensing circuits adjacent to the balancing/sensing circuit are in the "closed" state, and further wherein the deriving step is performed only when no adjacent switches are in the "closed" state.

6. The method of claim 1, further comprising the step of obtaining the calculated compensation factor by retrieving it from a memory device in which it is stored.

7. A method for estimating the voltage of a battery element of a vehicle battery system, the method comprising the steps of:
    providing a balancing/sensing circuit having a series resistive element and a series combination of a balancing switch and a balancing resistive element electrically connected in parallel with the battery element;
    calculating a compensation factor to account for a voltage drop occurring in the balancing/sensing circuit when the balancing switch is in a "closed" state;
    measuring the voltage across the combination of the balancing switch and balancing resistive element when the balancing switch is presumed to be in a "closed" state; and
    deriving a compensated value for the measured voltage by applying the calculated compensation factor to the measured voltage, wherein the compensated value compensates for a voltage drop associated with the series resistive element that occurs in the balancing/sensing circuit when the balancing switch is in the "closed" state and the compensated value represents an estimate of the actual voltage of the battery element.

8. The method of claim 7, further comprising the step of verifying that the balancing switch is in the "closed" state prior to deriving a compensated value for the measured voltage, and wherein the deriving step is performed only after the "closed" state of the balancing switch has been verified.

9. The method of claim 8, wherein the verifying step is performed following the measuring step and before the deriving step and comprises evaluating the measured voltage to determine if the balancing switch is in the "closed" state.

10. The method of claim 8, wherein the compensation factor comprises a voltage ratio and the applying step comprises multiplying the measured voltage by the voltage ratio.

11. The method of claim 10, wherein the calculating step comprises:
    acquiring a measurement of the voltage across the combination of the balancing switch and balancing resistive element when the balancing switch is in an "open" state ("$V_1$"); and
    acquiring a measurement of the voltage across the combination of the balancing switch and balancing resistive element when the balancing switch is in the "closed" state ("$V_2$"); and
    calculating the voltage ratio of the acquired voltages by dividing $V_1$ by $$V_2\left(\frac{V_1}{V_2}\right).$$

12. The method of claim 11, wherein the calculating step is performed prior to the measuring step.

13. The method of claim 1, further comprising the step of determining whether the balancing switches of any balancing/sensing circuits adjacent to the balancing/sensing circuit are in the "closed" state, and further wherein the deriving step is performed only when no adjacent switches are in the "closed" state.

14. A battery system for a vehicle, comprising:
    a battery element;
    a balancing/sensing circuit having a series resistive element and a series combination of a balancing switch and a balancing resistive element electrically connected in parallel with the battery element;
    a sensor electrically connected in parallel with, and configured to measure the voltage across, the combination of the balancing switch and balancing resistive element; and
    a control module configured to:
        receive an electrical signal representative of a voltage measured by the sensor across the combination of the balancing switch and balancing resistive element when the balancing switch is presumed to be in a "closed" state; and derive a compensated value for the measured voltage by applying a calculated compensation factor to the measured voltage, wherein the compensated value compensates for a voltage drop associated with the series resistive element that occurs in the balancing/sensing circuit when the balancing switch is in the "closed" state and the compensated value represents an estimate of the actual voltage of the battery element, and further wherein the calculated compensation factor is calculated from measurement(s) of one or more electrical parameters relating to the balancing/sensing circuit.

15. The system of claim 14, wherein:

the calculated compensation factor is a ratio of voltage measurements taken across the combination of the balancing switch and balancing resistive element when the balancing switch is in an "open" state ("$V_1$") and when the balancing switch is in the "closed" state ("$V_2$"), the voltage ratio comprising $$\left(\frac{V_1}{V_2}\right);$$

and further wherein the control module is configured to apply the voltage ratio by multiplying the measured voltage by the voltage ratio.

16. The system of claim 14, wherein the control module is further configured to verify that the balancing switch is in the "closed" state prior to deriving a compensated value for the measured voltage, and further wherein the control module is configured to only derive a compensated value after verifying that the balancing switch is in the "closed" state.

17. The system of claim 14, wherein the battery element is a first battery element and the balancing/sensing circuit is a first balancing/sensing circuit, and further wherein the system further comprises a second battery element and a second balancing/sensing circuit corresponding thereto, the control module being further configured to:

determine the state of the balancing switch of the second balancing/sensing circuit; and derive the compensated value only when the balancing switch of the second balancing/sensing circuit is in an "open" state.

18. The system of claim 14, wherein the control module is configured to retrieve the calculated compensation factor from a memory device in which it is stored.

19. The system of claim 14, wherein the control module is configured calculate the compensation factor using measurement(s) of one or more electrical parameters relating to the balancing/sensing circuit.

20. The system of claim 19, wherein the control module is further configured to calculate the compensation factor prior to measuring the voltage across the combination of the balancing switch and balancing resistive element.

\* \* \* \* \*